United States Patent
Ploessl

[11] Patent Number: 6,051,497
[45] Date of Patent: Apr. 18, 2000

[54] FORMATION OF SUB-GROUNDRULE FEATURES

[75] Inventor: Robert Ploessl, Glen Allen, Va.

[73] Assignee: Siemens Aktiengesellschaft, Munich, Germany

[21] Appl. No.: 08/884,732

[22] Filed: Jun. 30, 1997

[51] Int. Cl.[7] .......................... H01L 21/302; H01L 21/31
[52] U.S. Cl. ..................... 438/690; 438/692; 438/694; 438/700; 438/702; 438/759; 438/778
[58] Field of Search .................................. 438/270, 271, 438/272, 712, 714, 692, 624, 690, 694, 700, 702, 759, 778; 361/283.4

[56] References Cited

U.S. PATENT DOCUMENTS

| | | | |
|---|---|---|---|
| 5,328,553 | 7/1994 | Poon | 438/692 |
| 5,490,634 | 2/1996 | Zavracky et al. | 361/283.4 |
| 5,494,857 | 2/1996 | Cooperman et al. | 438/692 |
| 5,506,172 | 4/1996 | Tang | 438/684 |
| 5,639,692 | 6/1997 | Teong | 438/624 |
| 5,651,855 | 7/1997 | Dennison et al. | |
| 5,661,053 | 8/1997 | Yuan | 438/257 |

OTHER PUBLICATIONS

European Patent Office—Abstract of Japan, Pub. No. 10107161, dated Apr. 24, 1998.

European Patent Office—Abstract of Japan, Pub. No. 09148430, dated Jun. 6, 1997.

*Primary Examiner*—Benjamin L. Utech
*Assistant Examiner*—Donald L. Champagne
*Attorney, Agent, or Firm*—Stanton C. Braden

[57] ABSTRACT

A method of forming very small diameter metal lines in a dielectric layer 12 comprising forming an opening in the dielectric layer using photolithographic techniques, filling the opening with an insulating material 16 and planarizing the dielectric layer using chemical metal polishing techniques, which are continued so as to form small trenches 17 in the dielectric material on either side of the insulating material, filling in the trenches with metal and planarizing the metal layer using chemical metal polishing.

15 Claims, 2 Drawing Sheets

FORMATION OF SUB-GROUNDRULE FEATURES

This invention relates to the fabrication of sub-groundrule features in the manufacture of integrated circuits. More particularly, this invention relates to the formation of metal lines using chemical metal polishing techniques.

BACKGROUND OF THE INVENTION

In device fabrication, insulating, semiconducting, and conducting layers are formed on a substrate. The layers are patterned to create features and spaces. The features and spaces are patterned so as to form devices, such as transistors, capacitors and resistors. These devices are then interconnected to achieve a desired electrical function, forming an integrated circuit (IC). The formation and patterning of the various device layers are achieved using conventional fabrication techniques, such as oxidation, implantation, deposition, epitaxial growth of silicon, lithography, and etching. Such techniques are described in S. M. Sze, *VLSI Technology*, 2nd ed., New York, McGraw-Hill, 1988, which is herein incorporated by reference for all purposes.

The demand to further miniaturize ICs have resulted in features and spaces that are smaller and more closely packed to increase device density per unit area on the substrate. However, dimension of the features and spaces depends on the resolution capability of the lithographic system. This is referred to as the minimum feature size (F) or groundrule (GR).

Lithography for patterning the substrate to create features typically includes depositing a layer of photoresist on the surface of the substrate. An exposure source generating, for example, deep ultra-violet (DUV) radiation illuminates a mask containing the desired pattern. The illumination creates an image of the mask which is projected or printed on the substrate surface, selectively exposing the photoresist layer with DUV radiation. Depending on whether a positive or negative resist is used, either the exposed or unexposed portions of the resist layer are removed during development to selectively expose regions of the substrates below. The exposed regions are then patterned or etched by, for example, reactive ion etching (RIE) to create the features and spaces. Thus, the feature size is limited by the wavelength of the exposure source to create the mask image and the preciseness of the optical system that projects that image onto the resist layer.

To increase density or to extend the technology beyond that capable of current lithographic systems, there is a need to create features and spaces that are smaller than F or GR.

As an example, metal lines are used to electrically interconnect devices of an IC together. Metal lines are generally made either by 1) depositing a layer of metal on a semiconductor substrate, depositing a photoresist over the metal, and patterning the photoresist to form openings over the metal layer, and etching away the metal in the openings; or 2) forming openings or trenches in a substrate using photolithography and depositing metal in the openings. Excess metal can be removed by planarizing, either with an etchant or by chemical metal polishing techniques, to remove the excess metal down to the surface of the substrate.

To increase the density of the IC, smaller features such as the metal lines are required. Although one way of decreasing the feature size is to migrate to a more advanced lithographic system capable of producing smaller F, this requires significant capital expenditures. Moreover, the more advanced lithographic systems may not be feasible in a manufacturing setting as they increase raw process time or the materials associated with their use, such as resist, are very expensive.

Thus from the foregoing discussion, it is desirable to be able to produce sub-GR features.

SUMMARY OF THE INVENTION

I have discovered a method of forming small dimension metal lines in an insulator substrate utilizing chemical metal polishing techniques.

In accordance with the invention, a substrate with a first insulating layer is patterned using photolithography and etched to open a trench in the substrate. The trench is then filled in with a second insulating layer. This second insulating layer is then planarized using CMP until the second insulating layer is removed down to the surface of the first insulating layer, leaving the second insulating material as a plug only in the trenches.

CMP is continued until small trenches are formed on either side of the insulating plug. These trenches, which are sub-GR features, can then be filled with metal and the excess metal removed by CMP to form sub-GR lines.

Optionally the plug of insulating material remaining in the substrate can be etched away and replaced with the same insulating material as the first layer. Thus the first dielectric now has the same material throughout and has sub-GR metal lines therein.

DETAILED DESCRIPTION OF THE INVENTION

The invention relates to the formation of sub-GR features in semiconductor manufacturing. To facilitate discussion of the invention, it is described in the context of forming metal lines. However, the invention relates to the formation of sub-GR features in general. In one embodiment, the creation of sub-GR features is achieved with polishing such as chemical mechanical polishing (CMP).

Figure 1:
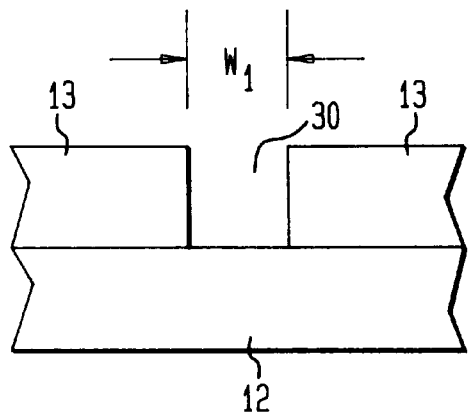
FIGS. 1–6 show the cross sectional view of a substrate during the process of forming sub-GR features in accordance with one embodiment of the invention.
Figure 2:
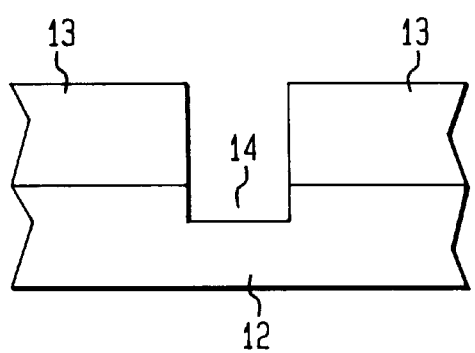

Referring to FIG. 1, a semiconductor substrate 12, such as a silicon wafer, is shown. Other substrates including germanium, gallium arsenide, silicon on insulator (SOI), or other semiconductor materials are also possible. The wafer includes an IC (not shown) fabricated thereon. Such IC includes, for example, a random access memory (RAM), dynamic RAM (DRAM), synchronous DRAM (SDRAM), read only memory (ROM), and application specific ICs (ASIC). An IC such as a logic device or other device is also possible. The IC can be at any stage of processing. Typically, a plurality of ICs are fabricated on the wafer in parallel. After processing is finished, the wafer is diced in order to separate it into chips. The chips are then packaged as final products. For ease of understanding, the invention is described as forming a single IC on a substrate.

Illustratively, an insulating layer 12 comprised of a dielectric material such as, for example, silicon oxide is deposited over the substrate 10 comprising the IC. Various oxides such as TEOS, silane oxide, SAUSG, LPTEOS, and HDP TEOS can be used to form the dielectric layer. Silicon nitride is also useful for forming the dielectric layer. The dielectric layer serves as an interlevel dielectric layer. The dielectric layer is sufficiently thick to provide electrical insulation between the substrate surface and the conductive layer. Typically, the dielectric layer is about several thousand Angstroms thick.

The insulating layer is patterned using conventional lithographic techniques. Such techniques include, for example, depositing a resist layer 13 that is sensitive to the wavelength of the exposure source of the lithographic system. A mask is used to selectively expose the resist with an exposure source. The exposed portion of the photoresist is then removed by a developer solvent, creating an opening 14 that exposes the dielectric layer below. Although the use of a positive resist is described above, other resist such as a negative resist is also useful.

Figure 3:
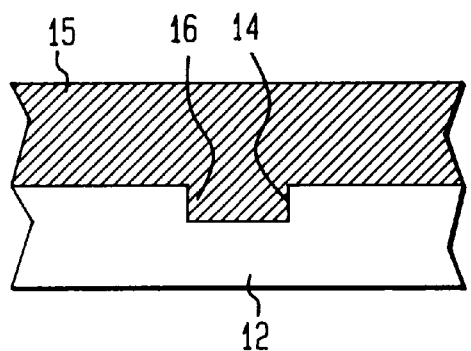

Referring to FIG. 3, the substrate is etched to remove a portion of the dielectric material 12 in region 14 that is unprotected by the resist. Such etch, for example, includes RIE. The depth of the region 14 is sufficiently deep to accommodate the depth of sub-GR features that are to be formed. Illustratively, the width W of opening 14 is about the GR of the lithographic system.

In FIG. 3, the resist layer is removed to expose the dielectric layer 12. An insulating layer 15 is then deposited over the dielectric layer, filling the opening 14 and surface of the dielectric layer 12. The insulating layer 15 can comprise of various materials. Such materials include polysilicon (poly), oxide or any insulating material as long as it is different from dielectric layer 12. The selectivity of the removal process, such as CMP, between layer 12 and layer 15 should be sufficient to remove layer 15 without effectively altering layer 12. In one embodiment, the selectivity between layer 12 and layer 15 is greater or equal to approximately 5:1 (layer 12:layer 15>about 5:1). In one embodiment, the insulating layer comprises poly. The thickness of the insulating layer 15 is sufficient to effectively fill the opening and also to enable a subsequent polishing process to form a planar surface between the dielectric layer 12 and insulating layer 15.

Figure 4:
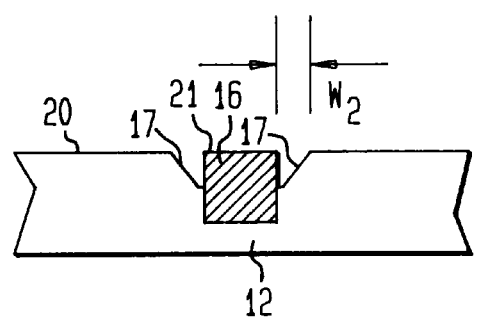

Referring to FIG. 4, the layer 15 is polished. In one embodiment, layer 15 is polished by, for example, chemical mechanical polishing (CMP). The CMP removes the insulating layer 15, exposing the surface of the dielectric layer 12. As a result, a plug 16 comprising the insulating layer material 15 remains in opening 14. The CMP process produces a planar surface with the plug 16 and dielectric layer 12.

In accordance with the invention, the CMP continues for a short time after the dielectric layer 12 has been exposed, over polishing the substrate. It has been found that the over polish removes portions 17 of the dielectric layer 12 at the interface with the insulating layer 15, while leaving the top surfaces 20 and 21 substantially planar. The width $w_2$ of the trenches are smaller than $w_1$. As such, the trenches are sub-GR features. The duration of the CMP process depends on the desired depth and width of the trenches that are to be formed. In addition, the duration depends on the removal rate of material 15. Typically the CMP overpolish time ranges in the order of about 10 to 60 sec.

Figure 5:
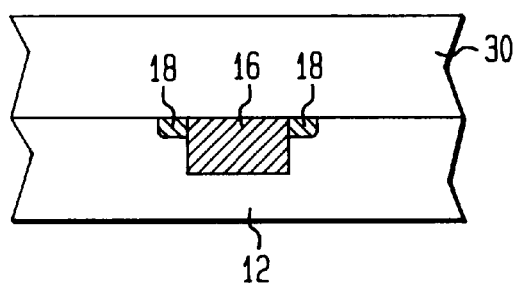

In FIG. 5, a layer 30 of conductive material is deposited on the substrate, filling the trenches 18 and covering the dielectric layer 13. The conductive material includes, for example, tungsten, aluminum, and copper. Other conductive materials that are used to interconnect devices within an IC are also useful. The thickness of the conductive material is sufficient to fill the trenches completely. Typically there are excess conductive material that flows over the top of the dielectric layer 12.

Figure 6:
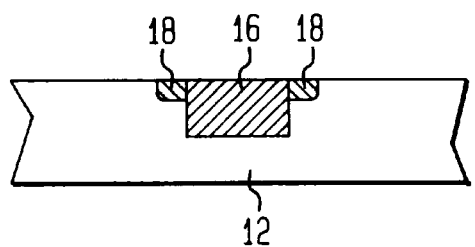

Referring to FIG. 6, the conductive layer is polished, exposing the surfaces of the plug 16 and dielectric layer 12. As a result, the trenches 18 are filled with the conductive material, forming metal lines used, for example, to interconnect devices of the IC.

Optionally, the plug 16 can be etched away using photolithographic techniques and replaced with the same material as the substrate 12. In that case all of the material in the substrate 12 will be the same except for the metal lines 18.

Figure 7:
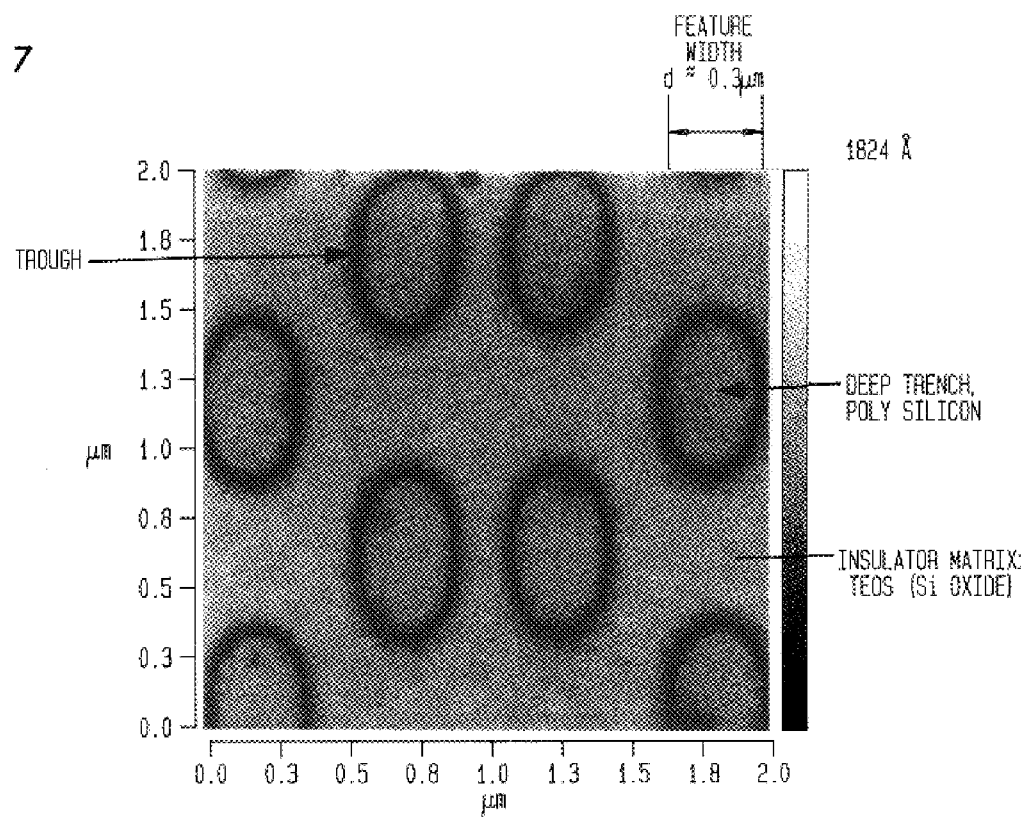
FIG. 7 is a photograph of openings in an insulating substrate surrounded by troughs made by chemical metal polishing using atomic force microscopy.

FIG. 7 is a photograph made using an atomic force microscope that illustrates the present invention. The substrate comprises a silicon oxide layer deposited thereon. The oxide layer was deposited by conventional chemical vapor deposition using tetraethoxysilane (TEOS) chemistry. The second insulating layer was undoped polysilicon. The opening made using photolithography was measured to be about 0.3 micron (3000 Å) wide and was filled with the polysilicon. The GR of the lithographic system used to form the opening was 0.25 $\mu$m.

After etching the opening and performing the CMP step, troughs were formed on either side of the openings, which can be seen in FIG. 7 as dark rings about the openings. These troughs were measured to be 590 Å deep and 630 Å wide and are thus much smaller than the GR of the lithographic system.

While the invention has been particularly shown and described with reference to various embodiments, it will be recognized by those skilled in the art that modifications and changes may be made to the present invention without departing from the scope thereof. Merely by way of example, the illustrative embodiments of the invention have been described with specific materials for the insulating and dielectric layers. Furthermore, the dimension of the openings can be varied for specific applications. The scope of the invention should therefore be determined not with reference to the above description but with reference to the appended claims along with their full scope of equivalents.

What is claimed is:

1. A method of forming a feature in the fabrication of integrated circuits comprising:

providing a substrate with dielectric layer deposited thereon;

forming an opening in a surface of the dielectric layer, such opening having a width;

depositing an insulating layer over the surface of the dielectric layer, filling the opening and covering the dielectric layer; and polishing the insulating layer to expose the dielectric layer to form an insulating stud in the opening, wherein the dielectric layer is overpolished to remove portions of the dielectric layer at an interface between the stud and dielectric layer, the removed portions forming the feature in the dielectric layer with a width smaller than the width of the opening.

2. The method recited in claim 1 including the step of depositing a conductor over the surface of the dielectric layer subsequent to forming the feature, portions of such conductor being deposited into the feature.

3. The method recited in claim 2 including the step of removing portions of the conductor on the surface of the dielectric layer while the portions of the conductor remain in the feature.

4. A method of forming a feature in the fabrication of integrated circuits comprising:

providing a substrate with dielectric layer deposited thereon;

forming a mask with a window therein over the dielectric layer, such window having a width;

forming an opening in a surface of the dielectric layer in registration with the window;

depositing an insulating layer over the surface of the dielectric layer, filling the opening and covering the dielectric layer; and polishing the insulating layer to expose the dielectric layer to form an insulating stud in the opening, wherein the insulating layer is overpolished to remove portions of the dielectric layer at an interface between the stud and dielectric layer, the removed portions forming the feature in the dielectric with a width smaller than the width of the opening.

5. The method recited in claim 4 including the step of depositing a conductor over the surface of the dielectric subsequent to forming the feature, portions of such conductor being deposited into the feature.

6. The method recited in claim 5 including the step of removing portions of the conductor on the surface of the dielectric while the portions of the conductor remain in the feature.

7. A method of forming a feature in the fabrication of integrated circuits comprising:

providing a substrate with dielectric layer deposited thereon;

forming a mask with an window therein over the dielectric layer, such window having a width;

forming an opening in a surface of the dielectric layer in registration with the window;

depositing an insulating layer over the surface of the dielectric layer, filling the opening and covering the dielectric layer, such insulating layer being a material different from the dielectric layer, the material of the insulating material having a polishing rate of removal than the dielectric layer; and polishing the insulating layer to expose the dielectric layer to form an insulating stud in the opening, wherein the insulating layer is overpolished to remove portions of the dielectric layer at an interface between the stud and dielectric layer, the removed portions forming the feature in the dielectric with a width smaller than the width of the opening.

8. The method recited in claim 7 including the step of depositing a conductor over the surface of the dielectric subsequent to forming the feature, portions of such conductor being deposited into the feature.

9. The method recited in claim 8 including the step of removing portions of the conductor on the surface of the dielectric while the portions of the conductor remain in the feature.

10. A method of forming a feature in the fabrication of integrated circuits comprising:

providing a substrate with dielectric layer deposited thereon;

forming a mask with an window therein over the dielectric layer, such window having a width;

forming an opening in a surface of the dielectric layer in registration with the window;

depositing an insulating layer over the surface of the dielectric layer, filling the opening and covering the dielectric layer, such insulating layer being a material different from the dielectric layer, the material of the insulating material having a polishing rate of removal greater than that of the dielectric layer; and polishing the insulating layer to expose the dielectric layer to form an insulating stud in the opening, wherein the insulating layer is overpolished to remove portions of the dielectric layer at an interface between the stud and dielectric layer, the removed portions forming the feature in the dielectric with a width smaller than the width of the opening while leaving the surface of the stud and the dielectric layer substantially planar.

11. The method recited in claim 10 including the step of depositing a conductor over the surface of the dielectric subsequent to forming the feature, portions of such conductor being deposited into the feature.

12. The method recited in claim 11 including the step of removing portions of the conductor remain in the surface of the dielectric while the portions of the conductor in the feature.

13. A method of forming a feature in the fabrication of integrated circuits comprising:

providing a substrate with dielectric layer deposited thereon;

forming a mask with an window therein over the dielectric layer, such window having a width;

forming a groove in a surface of the dielectric layer in registration with the window, such groove having a bottom portion and sidewalls;

depositing an insulating layer over the surface of the dielectric layer, filling the groove and covering the dielectric layer and the sidewalls, such insulating layer being a material different from the dielectric layer, the material of the insulating material having a polishing rate of removal greater than that of the dielectric layer; and chemical mechanically polishing the insulating layer to expose the dielectric layer to form an insulating stud in the groove, wherein the insulating layer is overpolished to remove portions of the dielectric layer at an interface between the stud and dielectric layer, the removed portions forming the feature in the dielectric with a width smaller than the width of the opening while leaving the surface of the stud and the dielectric layer substantially planar.

14. The method recited in claim 13 including the step of depositing a conductor over the surface of the dielectric subsequent to forming the feature, portions of such conductor being deposited into the feature.

15. The method recited in claim 14 including the step of removing portions of the conductor on the surface of the dielectric while the portions of the conductor remain in the feature.

* * * * *